(12) United States Patent
Hong et al.

(10) Patent No.: US 11,917,777 B2
(45) Date of Patent: Feb. 27, 2024

(54) ELECTRONIC DEVICE

(71) Applicant: Lenovo (Beijing) Limited, Beijing (CN)

(72) Inventors: Chuanbao Hong, Beijing (CN); Xiaopeng Wang, Beijing (CN)

(73) Assignee: LENOVO (BEIJING) LIMITED, Beijing (CN)

( * ) Notice: Subject to any disclaimer, the term of this patent is extended or adjusted under 35 U.S.C. 154(b) by 0 days.

(21) Appl. No.: 17/680,187

(22) Filed: Feb. 24, 2022

(65) Prior Publication Data

US 2023/0110625 A1 Apr. 13, 2023

(30) Foreign Application Priority Data

Sep. 30, 2021 (CN) .......................... 202111166577.6

(51) Int. Cl.
*H05K 5/00* (2006.01)
*H05K 5/02* (2006.01)

(52) U.S. Cl.
CPC ......... *H05K 5/0217* (2013.01); *H05K 5/0017* (2013.01)

(58) Field of Classification Search
CPC .................. H05K 5/0017; H05K 5/0217
USPC ........................................ 361/807
See application file for complete search history.

(56) References Cited

U.S. PATENT DOCUMENTS

| | | | |
|---|---|---|---|
| 10,963,014 B1* | 3/2021 | Park | H04B 1/3827 |
| 11,227,516 B1* | 1/2022 | Shin | G09F 9/30 |
| 2016/0081204 A1* | 3/2016 | Park | G06F 1/1652 |
| | | | 361/807 |
| 2020/0315036 A1* | 10/2020 | Ahn | H05K 5/0017 |
| 2020/0348727 A1* | 11/2020 | Lee | G06F 1/1624 |
| 2021/0185835 A1* | 6/2021 | Song | H05K 5/0017 |
| 2021/0200273 A1* | 7/2021 | Hong | H04M 1/0235 |
| 2022/0240400 A1* | 7/2022 | Zhou | G06F 1/1624 |

FOREIGN PATENT DOCUMENTS

| | | |
|---|---|---|
| CN | 112289196 A | 1/2021 |
| CN | 113035080 A | 6/2021 |
| CN | 113947999 A | 1/2022 |

* cited by examiner

*Primary Examiner* — Hung S. Bui
(74) *Attorney, Agent, or Firm* — ANOVA LAW GROUP, PLLC

(57) ABSTRACT

Electronic device is provided. The electronic device includes a flexible display screen; a support plate, fixedly arranged corresponding to at least part of the flexible display screen; and an adjusting mechanism, for driving the support plate to support the flexible display screen in a first state and driving the support plate to support the flexible display screen in a second state. The first state of the support plate is a flat support state. The second state of the support plate is a bent support state.

10 Claims, 7 Drawing Sheets

ELECTRONIC DEVICE

CROSS-REFERENCE TO RELATED APPLICATION

This application claims priority of Chinese Patent Application No. 202111166577.6, filed on Sep. 30, 2021, the entire content of which is hereby incorporated by reference.

FIELD OF THE DISCLOSURE

The present disclosure generally relates to the field of electronic device technology and, more particularly, relates to an electronic device.

BACKGROUND

Current electronic devices, when using a flexible display screen to achieve a screen expansion, often face problems of low overall structural strength and easy damage of the flexible display screen. Therefore, how to realize a screen expansion while ensuring that a screen life is not greatly reduced has become a technical problem to be solved urgently.

SUMMARY OF THE DISCLOSURE

One aspect of the present disclosure provides an electronic device. The electronic device includes a flexible display screen; a support plate, fixedly arranged corresponding to at least part of the flexible display screen; and an adjusting mechanism, for driving the support plate to support the flexible display screen in a first state and driving the support plate to support the flexible display screen in a second state. The first state of the support plate is a flat support state. The second state of the support plate is a bent support state.

Other aspects of the present disclosure can be understood by a person skilled in the art in light of the description, the claims, and the drawings of the present disclosure.

BRIEF DESCRIPTION OF THE DRAWINGS

To illustrate technical solutions in embodiments of the present disclosure more clearly, the following briefly introduces accompanying drawings that need to be used in a description of the embodiments. Obviously, the accompanying drawings in the following description are only some embodiments of the present disclosure. For a person skilled in the art, other drawings can also be obtained from the accompanying drawings without creative efforts.

Figure 1:
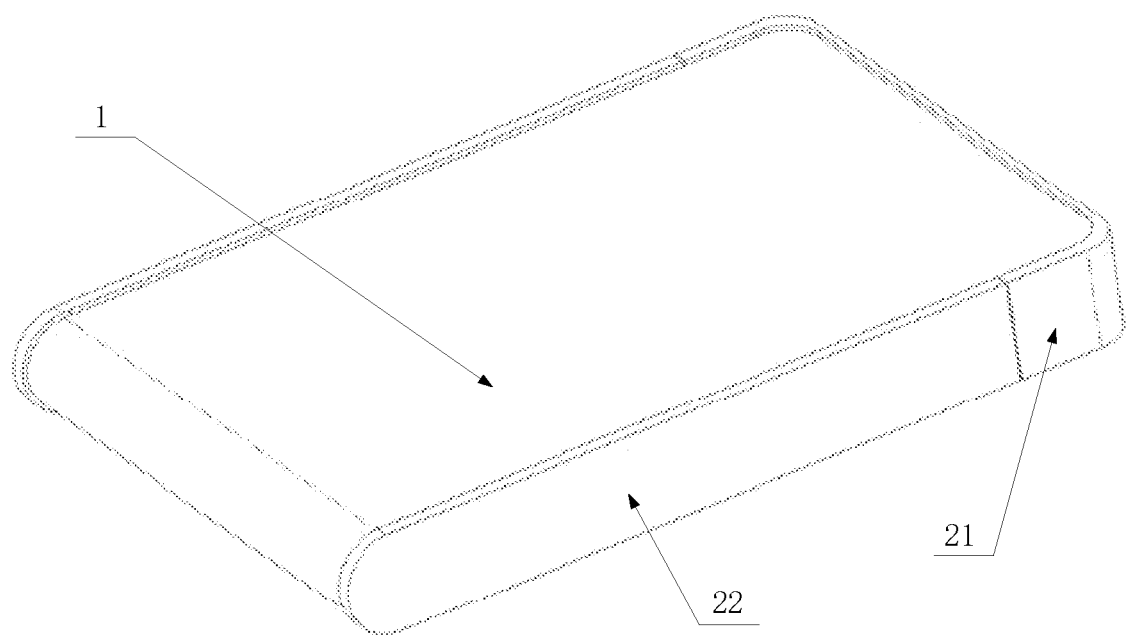
FIG. 1 illustrates a schematic diagram of an electronic device according to various embodiments of the present disclosure.

Reference numeral list: 1—flexible display screen; 21—first body; 22—second body; 211—push rod; 3—support plate; 31—support rib; 311—first part; 312—second part; 41—first guide rail; 42—second guide rail; 5—transmission device; 6—intermediate fixed shaft; 7—end moving shaft.

DETAILED DESCRIPTION

The present disclosure provides an electronic device which can effectively ensure that a screen has a longer service life while realizing a screen expansion.

The technical solutions in the embodiments of the present disclosure will be clearly and completely described below with reference to the accompanying drawings in the embodiments of the present disclosure. Obviously, the described embodiments are only some of the embodiments of the present disclosure, but not all the embodiments. Based on the embodiments in the present disclosure, all other embodiments obtained by a person skilled in the art without creative efforts shall fall within the protection scope of the present disclosure.

The present disclosure provides an electronic device, which can be a device with a flexible display screen, such as a tablet computer, a mobile phone, a monitor and other electronic device with a flexible display screen. A shape of the flexible display screen of the electronic device can be changed in various ways. For example, in one embodiment, the electronic device is foldable. The shape of the flexible display screen can be changed by folding. In another embodiment, the electronic device is rollable. The shape of the flexible display can be changed by rolling. In another embodiment, the electronic device is retractable. The shape of the flexible display screen can be changed by pushing and pulling.

In addition to the flexible display screen, the electronic device provided by the present disclosure also includes a support plate and an adjusting mechanism. The support plate is fixed at least corresponding to part of the flexible display screen. The adjusting mechanism drives the support plate to support the flexible display screen in a first state and drives the support plate to support the flexible display screen in a second state. The first state of the support plate is a flat support state, and the second state of the support plate is a bent support state. If the electronic device is foldable, taking a folding mobile phone as an example, a bending part of the folding mobile phone has two shapes: flat and curved. When the bending part is flat, the adjusting mechanism drives the support plate to assume a flat shape and supports the flexible display screen. When the bending part is curved, the adjusting mechanism drives the support plate to assume a curved shape and support the flexible display screen. If the electronic device is rollable, taking a roll-up display screen as an example, when the display screen is flattened, the adjusting mechanism drives the support plate to assume a flat shape and supports the flexible display screen. When the display screen is retracted at least partially, the adjusting mechanism drives the support plate to assume a curved shape and support the flexible display screen. When the flexible touch display screen is in a curved state, the embodiments provided in the present disclosure can provide an effective support for the flexible touch display screen by adjusting the electronic device so that the support plate fixed with the flexible touch display screen is bent synchronously with the flexible touch display screen, thereby preventing the flexible display from being in an unsupported free state, and effectively regulating an R angle of a flexible touch display screen when the flexible touch display screen is in a curved state.

Figure 2:
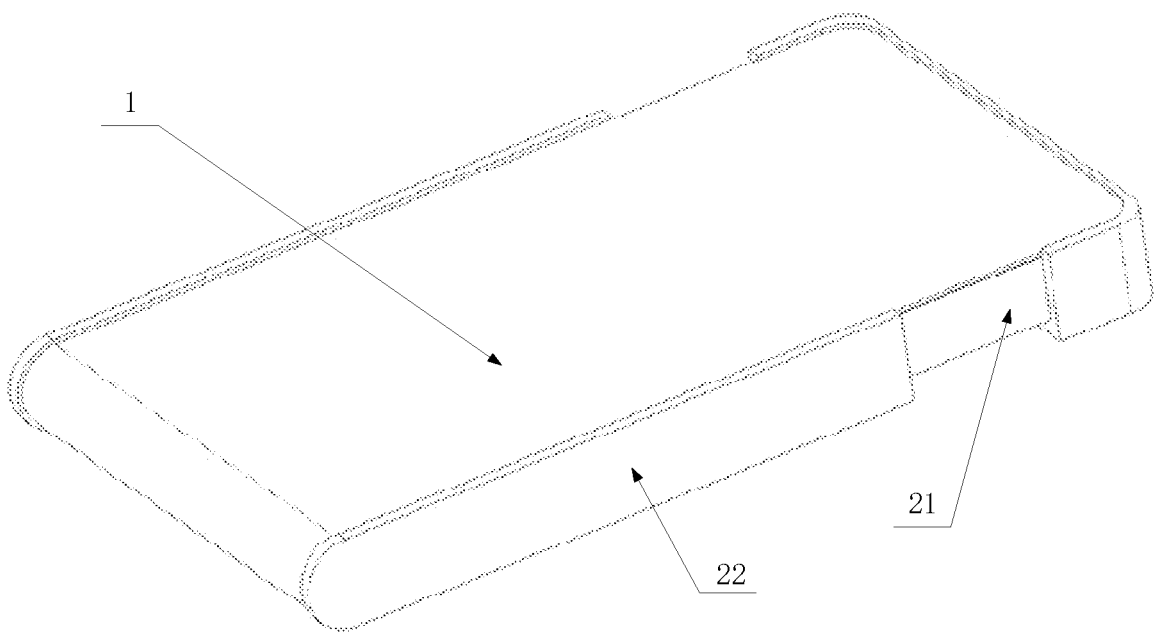
FIG. 2 illustrates a schematic diagram of an electronic device in another state according to various embodiments of the present disclosure.

Referring to FIG. 1, in one embodiment, a mobile phone is taken as an example to embody an electronic device in the accompanying drawings. The electronic device includes a flexible display screen 1, a first body 21 and a second body 22. The flexible display screen 1 is arranged on the first body 21. Relative positions of the first body 21 and the second body 22 are adjustable. That is, there is a first relative position shown in FIG. 2 and a second relative position shown in FIG. 1 between the first body 21 and the second body 22. As can be seen from FIG. 1 and FIG. 2, the first body 21 can be pulled out and pushed back from the second body 22, that is, the first body 21 and the second body 22 can be moved relative to each other. Switching between the first relative position and the second relative position is realized in a moving manner.

Figure 3:
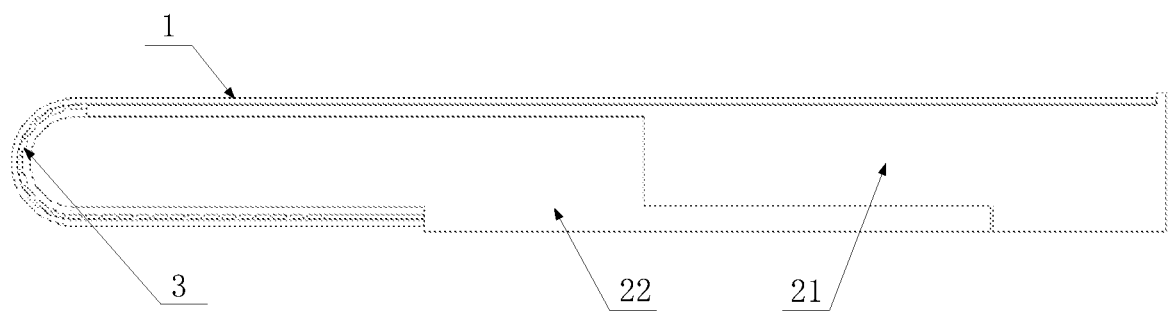
FIG. 3 illustrates a sectional view of an electronic device in a state shown in FIG. 1.
Figure 9:
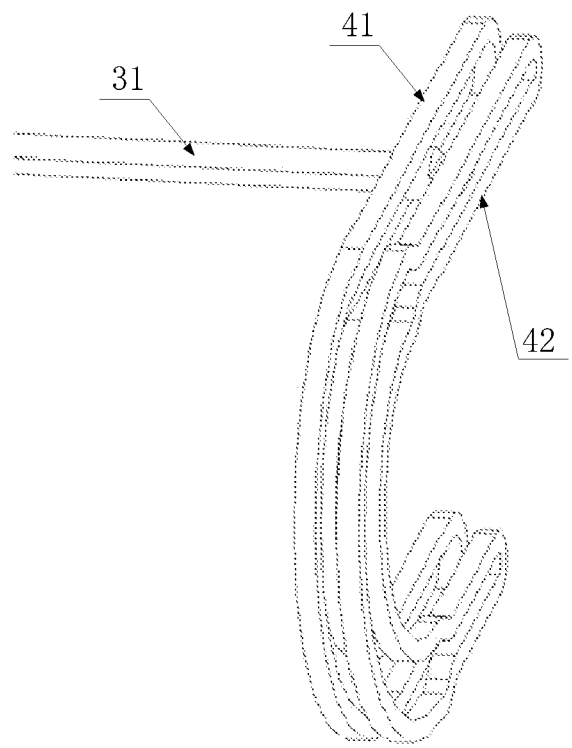
FIG. 9 illustrates a schematic diagram of a connection relationship between the support rib and an adjusting mechanism in FIG. 6.

As shown in FIG. 3, part of the flexible display screen 1 is fixedly covered on a surface of the first body 21, and a back of another part is arranged with a support plate 3. The support plate 3 is fixedly connected to the flexible display screen 1. Therefore, when the first body 21 moves relative to the second body 22, the flexible display screen 1 moves with the first body 21, and the support plate 3 moves with the flexible display screen 1. At a same time, adjusting mechanisms are arranged on the second body 22, the adjusting mechanisms are on two sides of the flexible display screen 1 but are blocked by the second body 22. Therefore, the adjusting mechanisms cannot be seen in FIG. 1 and FIG. 2. An adjusting mechanism of the present embodiment is shown in FIG. 9, which includes a first guide rail 41 and a second guide rail 42. For convenience, FIG. 9 shows only one side of the flexible display screen 1. Another side of the flexible display screen 1 is also arranged with a first guide rail 41 and a second guide rail 42. A function of the adjusting mechanism is to drive the support plate 3 to support the flexible display screen 1 in a first state, and to drive the support plate 3 to support the flexible display screen 1 in a second state. The first state of the support plate 3 is a flat support state, and the second state of the support plate 3 is a bent support state.

The flat support state means that at least part of the support plate 3 is flat and supports the flexible display screen 1. That is, a flat part of the support plate 3 is restricted in movement in a direction perpendicular to a surface of the flexible display screen 1. For example, the flat part of the support plate 3 abuts the adjusting mechanism in the above direction. The bent support state means that at least part of the support plate 3 is curved and forms a support for the flexible display screen 1. That is, the bent part of the support plate 3 is restricted in movement in the direction perpendicular to the surface of the flexible display screen 1. The bent part of the support plate 3 abuts against the adjusting mechanism along the above direction.

Since the support plate 3 is fixedly connected to the flexible display screen 1, and the support plate 3 can support the flexible display screen 1 in the first state and the second state, the flexible display screen 1 can have a curved shape and a flat shape. Through different presentations in shape, the flexible display screen 1 can realize a screen expansion. For example, referring to FIGS. 3 and 4, a section of the flexible display screen 1 corresponding to the support plate 3 shows a curved shape in FIG. 3. The section is not on an upper surface of the first body 21. However, in FIG. 4, the section of the flexible display screen 1 shows a flat shape and is on the upper surface of the first body 21, thereby realizing an expansion of the screen of the mobile phone. On the other hand, since the support plate 3 supports the flexible display screen 1 in the first state or in the second state, a movement of the flexible display screen 1 in the direction perpendicular to a surface thereof is restricted. Therefore, the flexible display screen 1 can withstand pressing without being deformed, thereby improving an overall structural strength of the flexible display screen 1 and ensuring that the flexible display screen 1 can have a long service life.

Figure 4:
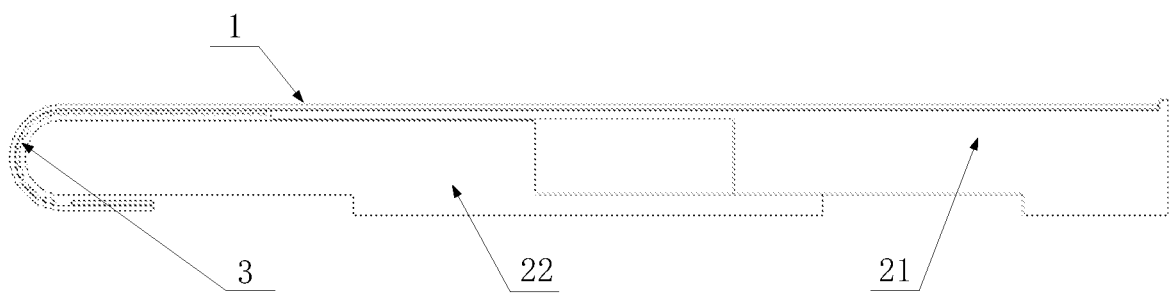
FIG. 4 illustrates a sectional view of an electronic device in a state shown in FIG. 2.
Figure 5:
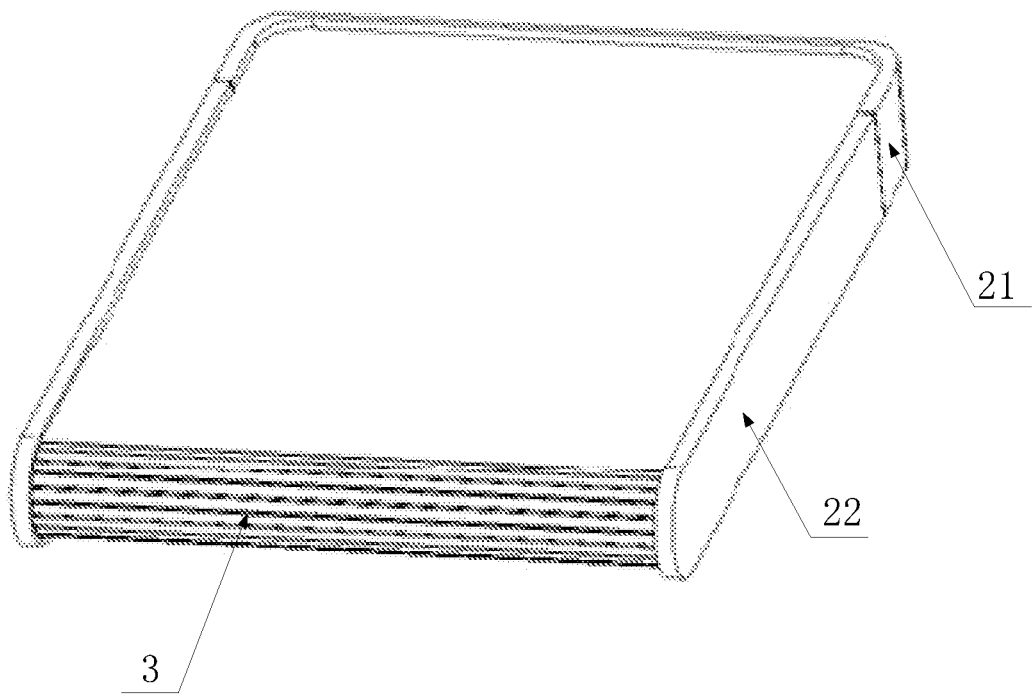
FIG. 5 illustrates a schematic diagram of the electronic device shown in FIG. 1 after a flexible display screen is removed.

As described above, the support plate 3 can support the flexible display screen 1 in the first state and can also support the flexible display screen 1 in the second state. Switching between the above two modes can be realized in various ways. For example, when the support plate 3 is applied to a foldable mobile phone, a shape of the support plate 3 can be changed by bending the mobile phone body. In the embodiment, the switching between the two modes is realized by the adjusting mechanism. That is, the adjusting mechanism controls the support plate 3 to switch between supporting the flexible display screen 1 in the first state and supporting the flexible display screen 1 in the second state. Specifically, as shown in FIG. 3, FIG. 4 and FIG. 9, the first guide rail 41 is arranged on a moving track of the flexible display screen 1, and the second guide rail 42 is arranged on one side of the first guide rail 41 and is also arranged on the flexible display screen 1 on the movement track. Therefore, in a process of the support plate 3 moving with the flexible display screen 1, the adjusting mechanism can control the support plate 3 to switch between supporting the flexible display screen 1 in the first state and supporting the flexible display screen 1 in the second state. A specific switching process is that when the supporting plate 3 moves to a first switching point, the adjusting mechanism controls the supporting plate 3 to switch from supporting the flexible display screen 1 in the second state to supporting the flexible display screen 1 in the first state. When the supporting plate 3 moves to a second switching point, the adjusting mechanism controls the supporting plate 3 to switch from supporting the flexible display screen 1 in the first state to supporting the flexible display screen 1 in the second state. The first switching point and the second switching point physically belong to a same position, that is, a boundary position between a flat part and a bent part of the adjusting mechanism. However, different names are used in a description to distinguish different switching processes. Taking a left end point of the upper surface of the first body 21 in FIG. 3 as an example, when the first body 21 moves to a right side relative to the second body 22 (i.e., an extraction process), as shown in FIG. 4, the support plate 3 changes from a curved shape to a flat shape when moving to the left end point of the upper surface of the first body 21. When the first body 21 moves in a reverse direction (i.e., a push-back process), the support plate 3 switches from a flat shape to a curved shape when moving to the left end point of the upper surface of the first body 21.

Figure 6:
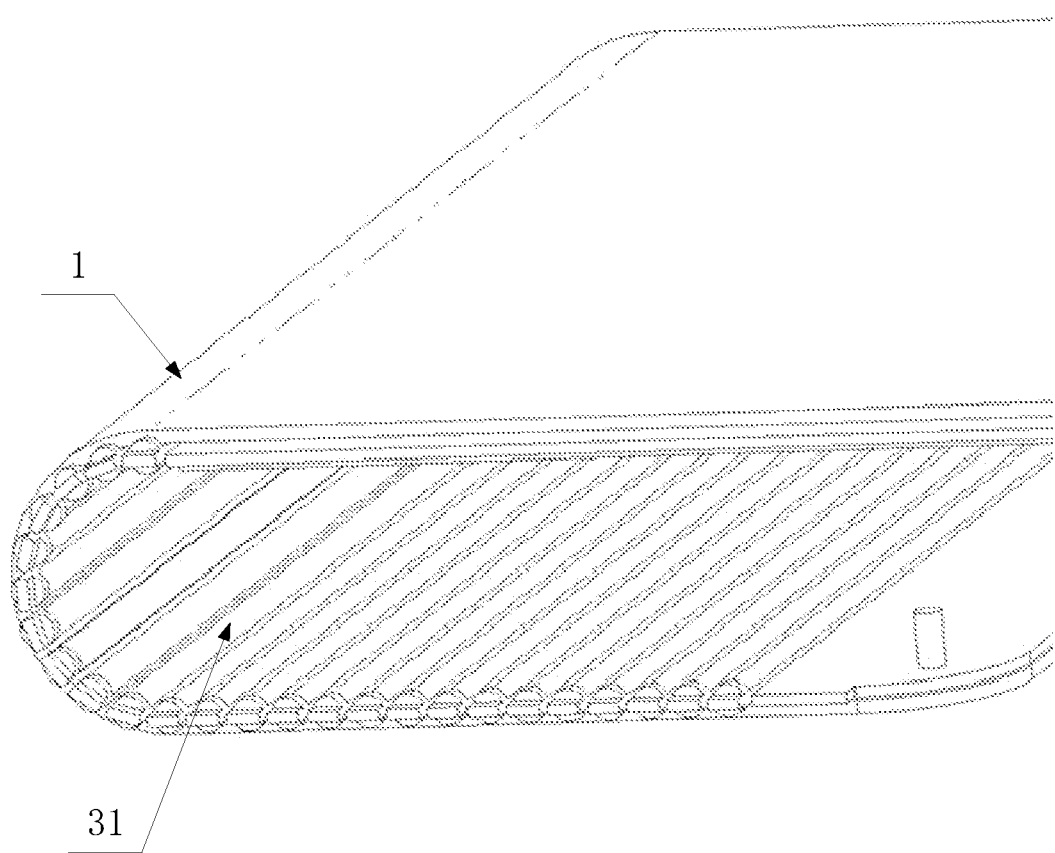
FIG. 6 illustrates a schematic diagram of a connection relationship between a support plate and the flexible display screen in FIG. 5.
Figure 7:
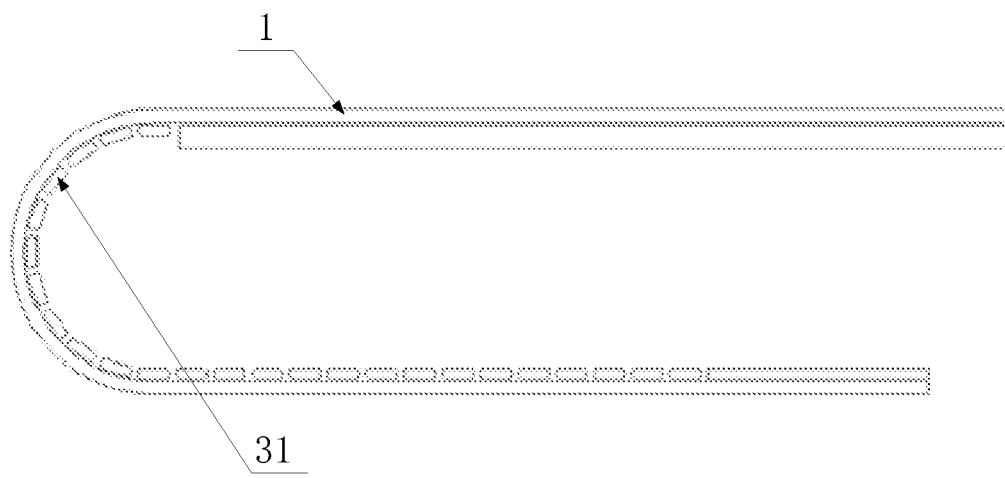
FIG. 7 illustrates a sectional view of FIG. 6.
Figure 8:
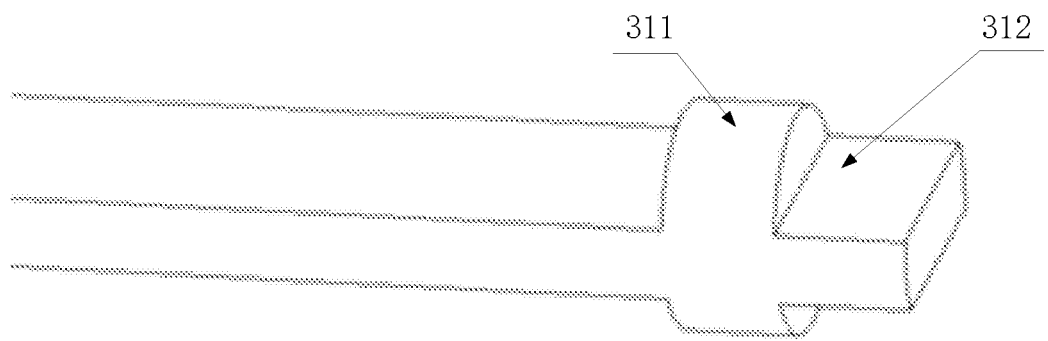
FIG. 8 illustrates a schematic diagram of an end of a support rib in FIG. 6.

As shown in FIGS. 6-8, in one embodiment, the support plate 3 includes a plurality of support ribs 31 arranged in parallel. The plurality of support ribs 31 integrally form a bamboo slip structure which allows the support plate 3 to use a larger thickness. Since there are gaps between the plurality of support ribs 31, the support plate 3 can be smoothly switched from a flat shape to a curved shape even if the support plate 3 is slightly thicker. As shown in FIG. 9, each of the plurality of support ribs 31 is arranged with a connection end at an end, and the connection end is movably connected to the adjusting mechanism. Specifically, referring to FIGS. 8 to 11, a first part 311 of the connection end is a cylinder, and a second part 312 of the connection end is a flat head. A planar part of a peripheral surface of the flat head is parallel or coplanar with a support surface of the support rib 31 for the flexible display screen 1. The first guide rail 41 is adapted to the first part 311 of the connection end. A track corresponding to a flat part on the second guide rail 42 is adapted to the second part 312 of the connection end.

Figure 10:
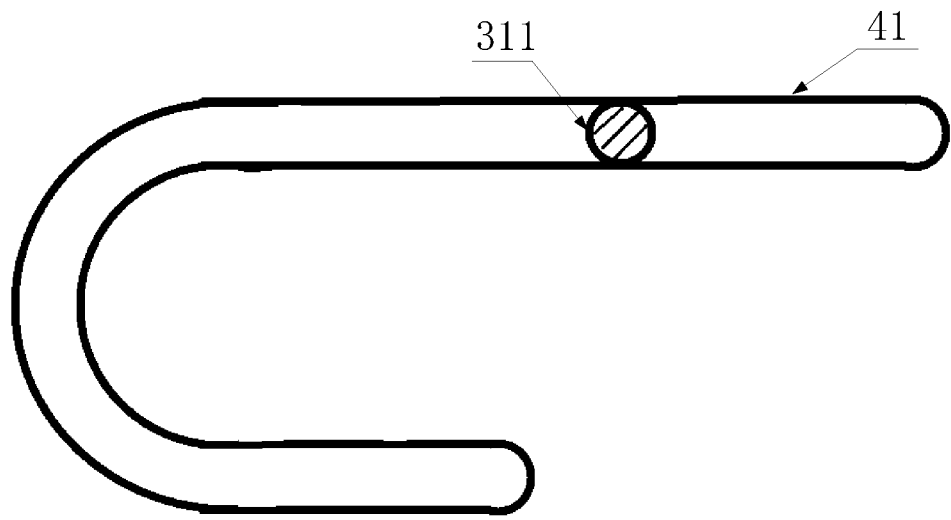
FIG. 10 illustrates a front view of a first guide rail in FIG. 9.
Figure 11:
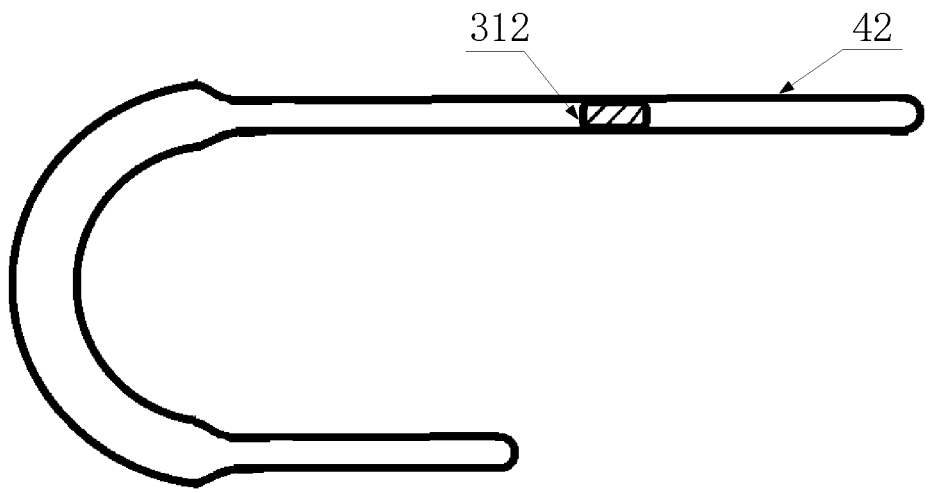
FIG. 11 illustrates a front view of a second guide rail in FIG. 9.

As can be seen from FIG. 9 and FIG. 10, the first part 311 of the connection end is passed through a guide groove of the first guide rail 41, and a width of the guide groove does not change over an entire length. That is, a width of the guide groove of a flat part is equal to a width of the guide groove of a bent part. Therefore, no matter where a support rib 31 is on the first guide rail 41, the support rib 31 may support the flexible display screen 1. However, since the first part 311 is a cylinder, a rotation of the support rib 31 cannot be completely restricted. Therefore, in one embodiment, a flat head, i.e., the second part 312, is designed on the connection end. The flat part of the second guide rail 42 is designed to adapt to the second part 312, that is, a width of the guide groove of the flat part of the second guide rail 42 matches a thickness of the flat head. As shown in FIG. 11, when the support rib 31 is in the flat part of the adjusting mechanism, the second part 312 may restrict a rotation of the support rib 31. To make the support rib 31 smoothly pass through the bent part of the adjusting mechanism, a bent part of the second guide rail 42 is designed according to a size of a circumscribed circle of the second part 312 in one embodiment. For example, a size of the circumscribed circle of the second part 312 is same as a cross-sectional size of the first part 311. The bent part of the second guide rail 42 may have a same size as the bent part of the first guide rail 41. If the flat part and the bent part of the second guide rail 42 are designed to have a same width, since the second part 312 is required not to rotate in a flat part, a flat part and a bent part being designed to have a same width is equivalent to a width of the guide groove of the bent part matching the thickness of the flat head. The flat head cannot pass through the bending part, i.e., the flat head at the bent part interferes with an inner wall of the guide groove, resulting in the flat head being stuck in the bent part and unable to pass through the bending part. On the other hand, if only the flat head and the second guide rail 42 are provided, the bent support state described in the present disclosure cannot be realized because the width of the guide groove of the bent part of the second guide rail 42 is greater than the thickness of the flat head. Therefore, there is a gap between the second part 312 and at least one inner wall of the guide groove when the second part 312 passes through the bent part. the bent part of the support plate 3 may lose a support of the second guide rail 42. Different from the above, the present disclosure ensures that the bent part of the support plate 3 may not lose support through a double rail design, that is, a bent support state is realized.

Referring to FIG. 3 and FIG. 4, in one embodiment, the second body 22 is arranged with a screen-hiding groove for accommodating the flexible display screen 1, and the flexible display screen 1 is flat in the screen-hiding groove. That is, the flexible display screen 1 bends around a left end of the first body 21 and enters the screen-hiding groove of the second body 22 and is flat in the screen-hiding groove. In FIG. 3, the first body 21 and the second body 22 are at the first relative position, and the adjusting mechanism drives the support plate 3 to support the flexible display screen 1 in the second state (i.e., the bent support state). The flexible display screen 1 on a first surface of the electronic device (i.e., an upper surface of the electronic device) has a first size. In FIG. 4, the first body 21 and the second body 22 are at the second relative position. The adjusting mechanism drives the support plate 3 to support the flexible display screen 1 in the first state (i.e., the flat support state). The flexible display screen 1 on the first surface of the electronic device has a second size. As can be seen from FIGS. 1 and 2, the second size is larger than the first size, that is, part of the flexible display screen 1 in the second body 22 is pulled out to expand part of the flexible display screen 1 exposed on the surface of the first body 21.

In other embodiments, after entering the second body 22, the flexible display screen 1 can also be in a curled shape like a clockwork. Alternatively, after bent around the left end of the first body 21, the flexible display screen 1 may not enter the second body 22 but is exposed on a surface of the second body 22. Therefore, information can be displayed on two opposite surfaces (e.g., front and back surfaces) of the electronic device through the flexible display screen 1.

In one embodiment, the flexible display screen 1 is in the screen-hiding groove in a flat shape. in a process of switching the first body 21 and the second body 22 between the first relative position and the second relative position, in a process of the support plate 3 moving with the flexible display screen 1, the adjusting mechanism controls the support plate 3 to switch between supporting the flexible display screen 1 in the first state and supporting the flexible display screen 1 in the second state.

To make a relative movement of the first body 21 and the second body 22 more stable, a rack extending along a moving direction can be arranged on a side of the first body 21 close to the second body 22, and the second body 22 is arranged with a gear engaged with the rack. Similarly, to make a relative movement of the flexible display screen 1 and the second body 22 more stable, chains may be provided on two sides of the flexible display screen 1, and sprockets engaged with the chains may be arranged on the second body 22.

To ensure that the first body 21 and the second body 22 can stop at a preset position after moving in place, a limiting protrusion can be arranged on a side of the second body 22 close to the first body 21, and a snap joint for matching with the limiting protrusion can be arranged on the first body 21. When the first body 21 moves to the preset position relative to the second body 22, the snap joint abuts against the limiting protrusion. For example, after pulled out to a position shown in FIG. 2, the first body 21 can no longer be pulled out by arranging the snap joint and the limiting protrusion. Specifically, a groove for accommodating the limiting protrusion may be arranged on the side of the first body 21 close to the second body 22, and a groove wall of the groove may be used as the snap joint.

Figure 12:
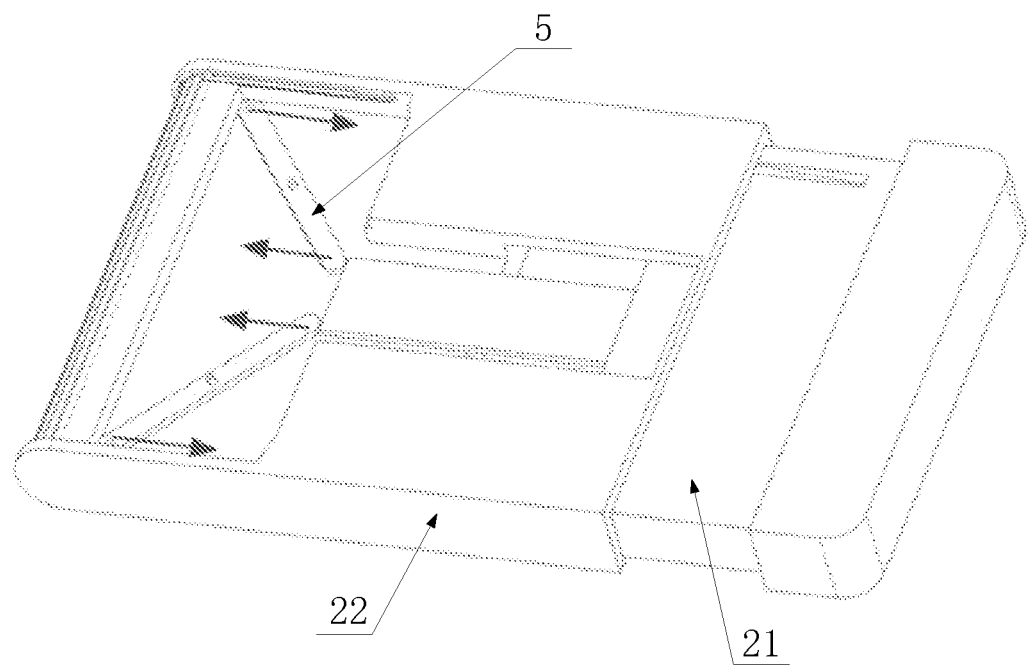
FIG. 12 illustrates a schematic diagram of an internal structure of the electronic device shown in FIG. 2 after turned over.
Figure 13:
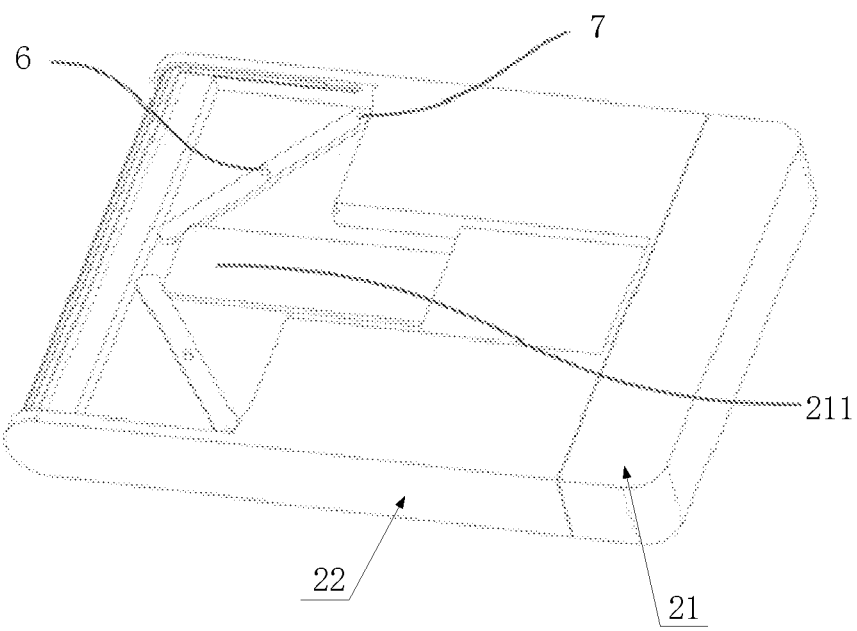
FIG. 13 illustrates a schematic diagram of an internal structure of the electronic device shown in FIG. 1 after being turned over.
Figure 14:
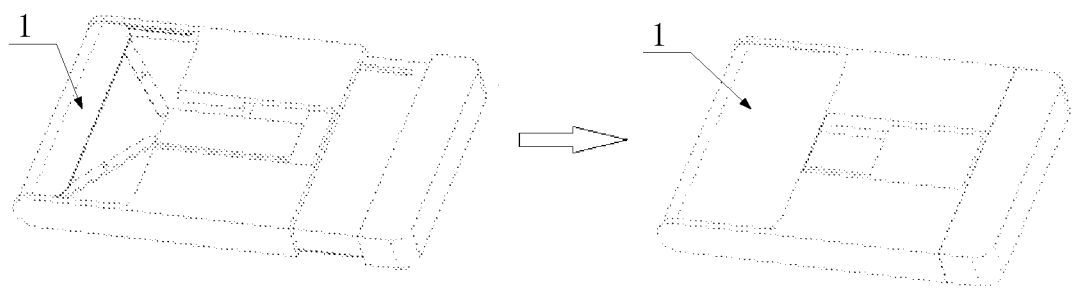
FIG. 14 illustrates a schematic diagram of a position change of a flexible display screen according to various embodiments of the present disclosure.

Referring to FIG. 12 and FIG. 13, to better pull the support plate 3 back into the second body 22, in one embodiment, a transmission device 5 is arranged between the support plate 3 and the first body 21. A component linkage is realized through a leverage principle. An intermediate fixed shaft 6 is arranged on the second body 22, an end moving shaft 7 is arranged on the support plate 3, and a push rod 211 is arranged on the first body 21. As shown by direction arrows in FIG. 12, the first body 21 can move the end moving shaft 7 through the transmission device 5 in a process of pushing back the second body 22. In the process, a position change of the flexible display screen 1 is shown in FIG. 14, that is, a size of the flexible display screen 1 on a side increases as the support plate 3 is pulled back to the second body 22. The transmission device 5 may also adopt another structural form, such as a fixed pulley mechanism. As can be seen from FIG. 14, the push rod 211 may be exposed on a surface of the second body 22, so that a finger contact surface can be provided for a human hand. The first body 21 can be moved relative to the second body 22 by pressing and rubbing the push rod 211, which is convenient for one-handed operation. To avoid damages of the first body 21 and the second body 22 when the first body 21 and the second body 22 move relative to each other due to a poor hand control, the electronic device may further include a power device to provide power for the first body 21 and the second body 22 to switch between the first relative position and the second relative position. For example, a miniature electric push rod is arranged in the electronic device. The power device is electrically connected to a controller of the electronic device, and a start switch can be a physical button or a virtual button.

As disclosed, an electronic device provided by the present disclosure is arranged with a support plate fixedly arranged at least corresponding to part of a flexible display screen and is arranged with an adjusting mechanism. The adjusting mechanism drives the support plate to support the flexible display screen in a first state and drives the support plate to support the flexible display screen in a second state. The first state of the support plate is a flat support state. The second state of the support plate is a bent support state. Since the support plate is fixedly connected to the flexible display screen, and the support plate can support the flexible display screen in the first state and the second state, the flexible display screen can have a curved shape and a flat shape. The flexible display screen can realize a screen expansion through different presentations in shape. At a same time, since the support plate also supports the flexible display screen when it is in a curved shape, a bent part of the flexible display screen can be pressed without being deformed, thereby improving an overall structural strength of the flexible display screen and ensuring that the flexible display screen can have a long service life.

The above description of the disclosed embodiments enables a person skilled in the art to implement or use the present disclosure. Various modifications to these embodiments will be apparent to a person skilled in the art, and the general principles defined herein may be implemented in other embodiments without departing from the spirit or scope of the present disclosure. Therefore, the present disclosure is not limited to the embodiments shown herein but conforms to a widest scope consistent with the principles and novel features disclosed herein.

What is claimed is:

1. An electronic device, comprising:
a flexible display screen;
a support plate, fixedly arranged corresponding to at least part of the flexible display screen; and
an adjusting mechanism, for driving the support plate to support the flexible display screen in a first state, and driving the support plate to support the flexible display screen in a second state,
wherein:
the first state of the support plate is a flat support state, and the second state of the support plate is a bent support state; and
the adjusting mechanism comprises a flat part and a bent part, a boundary between the flat part and the bent part comprises a switching point, and the adjusting mechanism controls the support plate to switch between supporting the flexible display screen in the first state and supporting the flexible display screen in the second state when the support plate moves to the switching point.

2. The electronic device according to claim 1, wherein the adjusting mechanism controls the support plate to switch between supporting the flexible display screen in the first state and supporting the flexible display screen in the second state in a process of the support plate moving with the flexible display screen.

3. The electronic device according to claim 2, wherein:
the switching point includes a first switching point and a second switching point;
the adjusting mechanism controls the support plate to switch from supporting the flexible display screen in the second state to supporting the flexible display screen in the first state when the support plate moves to the first switching point; and
the adjusting mechanism controls the support plate to switch from supporting the flexible display screen in the first state to supporting the flexible display screen in the second state when the support plate moves to the second switching point.

4. The electronic device according to claim 3, wherein the support plate includes a plurality of support ribs arranged in parallel, each of the plurality of support ribs is arranged with a connection end at an end, and the connection end is movably connected to the adjusting mechanism.

5. The electronic device according to claim 4, wherein adjusting mechanism comprises:
a first guide rail, arranged on a moving track of the flexible display screen, and adapted to a first part of the connection end; and
a second guide rail, arranged on a moving track of the flexible display screen and located on one side of the first guide rail.

6. The electronic device according to claim 5, wherein a track corresponding to the flat part on the second guide rail is adapted to a second part of the connection end.

7. The electronic device according to claim 6, wherein the first part of the connection end is a cylinder, the second part of the connection end is a flat head, and a planar part of a peripheral surface of the flat head is parallel to or coplanar with a support surface of the support rib for the flexible display screen.

8. The electronic device according to claim 1, comprising:
a first body and a second body, wherein:
the first body and the second body are located at a first relative position, the adjusting mechanism drives the support plate to support the flexible display screen in the second state, the flexible display screen on a first surface of the electronic device has a first size, the first body and the second body are located at a second relative position, and the adjusting mechanism drives the support plate to support the flexible display screen in the first state, the flexible display screen on the first surface of the electronic device has a second size, and the second size is larger than the first size; and/or in a process of switching the first body and the second body between the first relative position and the second relative position, in a process of the support plate moving with the flexible display screen, the adjusting mechanism controls the support plate to switch between supporting the flexible display screen in the first state and supporting the flexible display screen in the second state.

9. The electronic device according to claim 8, further comprising:

a power device for providing power for switching the first body and the second body between the first relative position and the second relative position.

10. An electronic device, comprising:

a flexible display screen;

a support plate, fixedly arranged corresponding to at least part of the flexible display screen; and an adjusting mechanism, for driving the support plate to support the flexible display screen in a first state, and driving the support plate to support the flexible display screen in a second state, wherein:

the first state of the support plate is a flat support state, and the second state of the support plate is a bent support state; and the support plate includes a plurality of support ribs arranged in parallel, each of the plurality of support ribs is arranged with a connection end at an end, and the connection end is movably connected to the adjusting mechanism.

* * * * *